United States Patent
Eichenberg et al.

(10) Patent No.: US 9,780,273 B2
(45) Date of Patent: Oct. 3, 2017

(54) OPTOELECTRONIC COMPONENT

(71) Applicant: OSRAM Opto Semiconductors GmbH, Regensburg (DE)

(72) Inventors: Boris Eichenberg, Schierling (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/784,414

(22) PCT Filed: Apr. 16, 2014

(86) PCT No.: PCT/EP2014/057705
§ 371 (c)(1),
(2) Date: Oct. 14, 2015

(87) PCT Pub. No.: WO2014/170363
PCT Pub. Date: Oct. 23, 2014

(65) Prior Publication Data
US 2016/0064634 A1  Mar. 3, 2016

(30) Foreign Application Priority Data
Apr. 19, 2013  (DE) .................. 10 2013 207 111

(51) Int. Cl.
*H01L 33/00* (2010.01)
*H01L 33/62* (2010.01)
*H01L 33/54* (2010.01)
*H01L 33/48* (2010.01)
*H01L 33/52* (2010.01)

(52) U.S. Cl.
CPC ............ *H01L 33/62* (2013.01); *H01L 33/486* (2013.01); *H01L 33/54* (2013.01); *H01L 33/48* (2013.01); *H01L 33/52* (2013.01); *H01L 2924/0002* (2013.01); *H01L 2933/0033* (2013.01); *H01L 2933/0066* (2013.01)

(58) Field of Classification Search
CPC ... H01L 33/44; H01L 33/507; H01L 25/0753; H01L 25/0756
USPC ...................................... 257/98–99
See application file for complete search history.

(56) References Cited

U.S. PATENT DOCUMENTS

| 2003/0116769 A1* | 6/2003 | Song | H01L 25/0753 257/79 |
| 2005/0236638 A1 | 10/2005 | Tsukagoshi et al. | |
| 2009/0159912 A1 | 6/2009 | Engl et al. | |

(Continued)

FOREIGN PATENT DOCUMENTS

| DE | 10 2004 045 947 A1 | 1/2006 |
| DE | 10 2006 005 299 A1 | 8/2007 |

(Continued)

*Primary Examiner* — Cuong Q Nguyen
(74) *Attorney, Agent, or Firm* — DLA Piper LLP (US)

(57) ABSTRACT

An optoelectronic component includes a carrier substrate; at least one light emitting semiconductor chip arranged on a surface of the carrier substrate; and a frame part at least laterally partly surrounding the light emitting semiconductor chip; and comprising an injection-molded body, and wherein the frame part includes an injection-molded body and a diaphragm part, the diaphragm part including a protuberance enclosed by the injection-molded body.

12 Claims, 2 Drawing Sheets

(56) References Cited

U.S. PATENT DOCUMENTS

| | | | |
|---|---|---|---|
| 2009/0267107 A1* | 10/2009 | Weber-Rabsilber | H01L 33/44 257/99 |
| 2010/0053929 A1 | 3/2010 | Bisberg | |
| 2010/0264438 A1 | 10/2010 | Suenaga | |
| 2011/0013393 A1* | 1/2011 | Ishio | G02B 19/0014 438/27 |
| 2011/0096526 A1* | 4/2011 | Katabe | H01L 33/507 362/84 |

FOREIGN PATENT DOCUMENTS

| | | |
|---|---|---|
| DE | 10 2006 046 301 A1 | 4/2008 |
| DE | 10 2007 011 123 A1 | 9/2008 |
| DE | 10 2008 015 550 A1 | 10/2009 |
| DE | 10 2008 049 399 A1 | 4/2010 |
| DE | 10 2010 023 815 A1 | 12/2011 |

\* cited by examiner

OPTOELECTRONIC COMPONENT

TECHNICAL FIELD

This disclosure relates to an optoelectronic component comprising a carrier substrate, at least one light emitting semiconductor chip arranged on a surface of the carrier substrate, and a frame part, which laterally at least partly surrounds the light emitting semiconductor chip.

This application claims priority of DE 10 2013 207 111.6, the content of which is hereby incorporated by reference.

BACKGROUND

During production of surface mounted semiconductor components (surface mounted device, SMD) such as, e.g., light emitting diodes (LEDs), a light emitting semiconductor chip is often positioned in a diaphragm frame which forms a cavity around the light emitting semiconductor chip. Such optoelectronic components are used inter alia in the automotive sector for vehicle lighting, wherein the light emitting semiconductor chip of the optoelectronic component is generally composed of a multiplicity of light emitting diodes in the form of an LED array.

To generate a homogeneous radiation pattern, a potting compound composed of silicone admixed with titanium dioxide is used as material for encapsulation of the light emitting semiconductor chip in the cavity formed by the diaphragm frame. In general, a frame part composed of monocrystalline silicon is used as the diaphragm frame. This is because in use as a low-beam arrangement, a defined region having the sharpest possible contour at at least one edge (diaphragm edge) is demanded besides a homogeneous radiation pattern. Functionality as a diaphragm can be realized by the silicon frame part since a precise shaping of such a frame part is possible.

Such a surface mounted optoelectronic component is described, for example, in DE 10 2010 023 815.

Disadvantages when using a frame part composed of monocrystalline silicon include the high costs and the risk of breaking during production and mounting. That problem is aggravated if, as the size of the light emitting semiconductor chip increases, a constant or even decreasing thickness of the silicon frame part is demanded.

It could therefore be helpful to provide an optoelectronic component comprising an improved frame part which can serve as delimitation for the liquid potting compound and also can perform the functionality of a diaphragm. The improved frame part is intended to be cost-effective and reliable during production and mounting.

SUMMARY

We provide an optoelectronic component including a carrier substrate; at least one light emitting semiconductor chip arranged on a surface of the carrier substrate; and a frame part at least laterally partly surrounding the light emitting semiconductor chip and including an injection-molded body.

We also provide an optoelectronic component including a carrier substrate; at least one light emitting semiconductor chip arranged on a surface of the carrier substrate; and a frame part at least laterally partly surrounding the light emitting semiconductor chip, wherein the frame part includes an injection-molded body and a diaphragm part, the diaphragm part including a protuberance enclosed by the injection-molded body.

We further provide an optoelectronic component including a carrier substrate; at least one light emitting semiconductor chip arranged on a surface of the carrier substrate; a frame part at least laterally partly surrounding the light emitting semiconductor chip and forming a cavity; and a contact structure arranged on the surface of the carrier substrate and extending below the frame part into a cavity and spaced apart from the light emitting semiconductor chip, wherein the contact structure and the light emitting semiconductor chip electrically connect via a connecting line, and the frame part has, at the upper inner edge facing the light emitting semiconductor chip, a projection extending at least partly over the contact structure.

LIST OF REFERENCE SIGNS

Figure 1A:
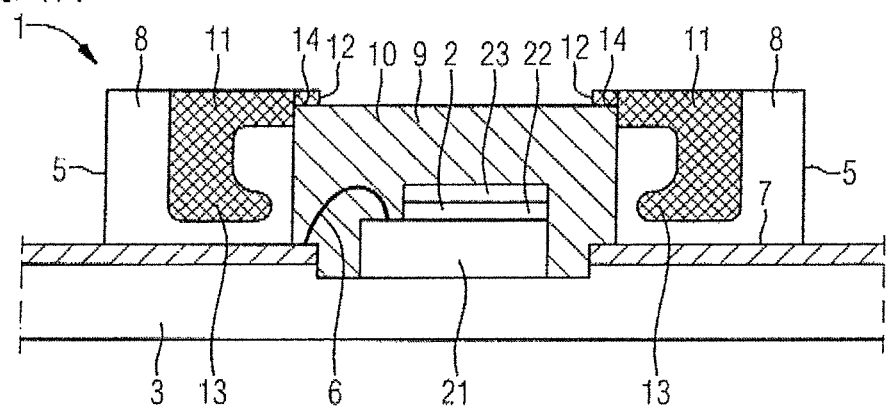
FIGS. 1A and 1B show one example of an optoelectronic component in sectional view (FIG. 1A) and plan view (FIG. 1B).

1 optoelectronic component
2 light emitting semiconductor chip
3 carrier substrate
4 contact structure
5 frame part
6 connecting line
8 injection-molded body
9 cavity
10 potting compound
11 diaphragm part
12 upper inner edge of the diaphragm part
13 protuberance of the diaphragm part
14 projection
21 ceramic carrier
22 LED chip
23 converter

DETAILED DESCRIPTION

Our optoelectronic component comprises a carrier substrate, at least one light emitting semiconductor chip fixed on a surface of the carrier substrate, and a frame part, which laterally at least partly surrounds the light emitting semiconductor chip. In this case, the frame part comprises an injection-molded body.

Producing the frame part in the form of an injection-molded body has the advantage of an improved mechanical stability. A significantly improved reliability during production and mounting is afforded compared to the silicon frame part used in the prior art. This in turn enables significantly larger or longer LED arrays. Moreover, compared to the silicon frame part, it is possible to produce and use thinner frame parts. In addition, such a frame part can be produced at significantly lower costs compared to the silicon frame part.

Preferably, the frame part is closed around the light emitting semiconductor chip and forms a cavity at least partly filled with a potting compound. Use of the potting compound serves for encapsulation of the light emitting semiconductor chip. The optoelectric semiconductor chip is protected by the encapsulation and, at the same time, a homogeneous luminance of LED arrays can be achieved by a suitable potting compound. The frame part closed around the light emitting semiconductor chip can advantageously act as a delimitation for the liquid potting compound.

Further preferably, a contact structure is arranged on the surface of the carrier substrate. In this case, the contact structure extends below the frame part into the cavity and is spaced apart from the light emitting semiconductor chip, wherein the contact structure and the light emitting semiconductor chip electrically connect via a connecting line. The frame part additionally has, at the upper inner edge facing the light emitting semiconductor chip, a projection extending at least partly over the contact structure. This configuration achieves an improved protection of the connecting line against mechanical damage, in particular in the context of the production process before encapsulation with a potting compound.

Further preferably, the frame part has at its top side a diaphragm part connected to the injection-molded body. In this case, the diaphragm part forms the upper inner edge of the cavity. As a result, the frame part can advantageously be used as a diaphragm since it is possible to manufacture the edges of the diaphragm part with very small tolerances. A region having a sharp contour with high luminance can be realized as a result.

Preferably, the diaphragm part has metallic conductivity. This has the advantage that component parts arranged on the carrier substrate and for which the conductor tracks would cross on the surface of the carrier substrate can electrically connect to one another via the diaphragm part. Moreover, it is possible to make electrical contact with the light emitting semiconductor chip via the diaphragm part.

The components are illustrated in the accompanying drawings and explained in greater detail in the following description of figures.

The figures show schematic illustrations of one possible example of an optoelectronic component. The size relationships of the elements illustrated in the figures among one another should not be regarded as to scale. Rather, individual elements may be illustrated with exaggerated size to enable better illustration and/or afford a better understanding. Elements that are identical, of identical type or act identically are provided with the same reference signs in the figures.

Figure 1B:
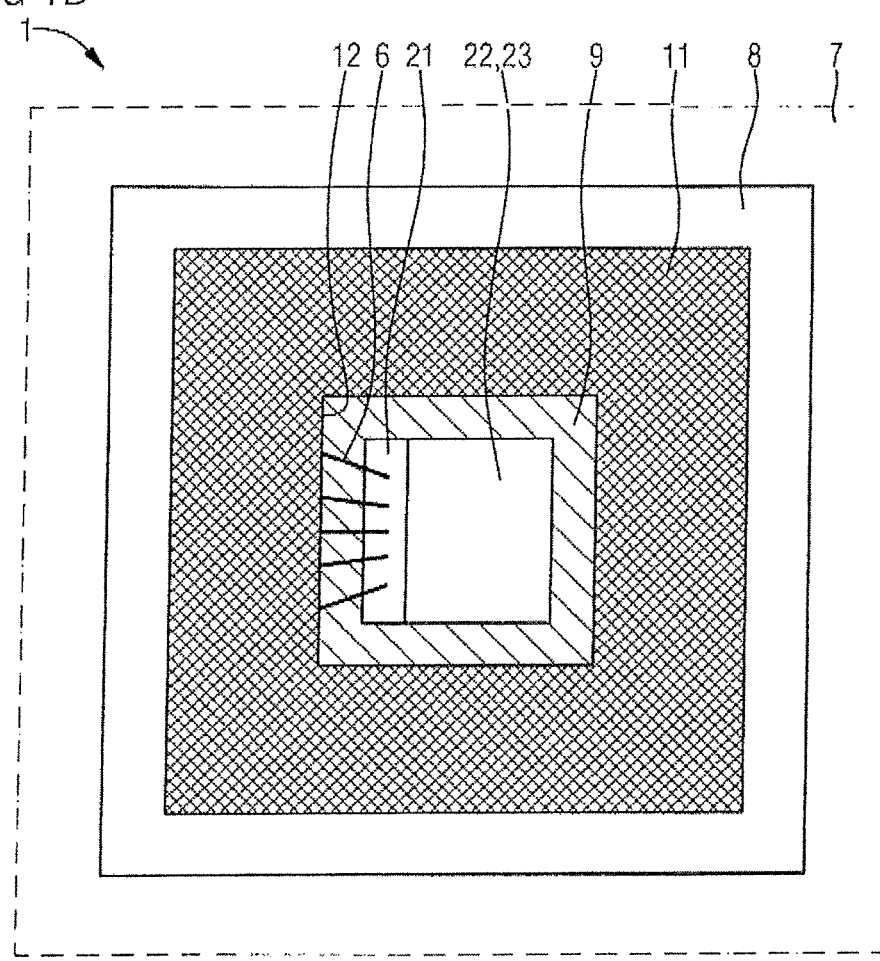

As shown in FIG. 1A (sectional view) and FIG. 1B (plan view), the optoelectronic component 1 comprises a light emitting semiconductor chip 2 fixed on a surface of a carrier substrate 3. The light emitting semiconductor chip 2 can be a chip having an individual light emitting diode. Instead of an individual light emitting element, a chip array, e.g., an LED array composed of a multiplicity of individual light emitting diodes, can also be present. Light emitting semiconductor chips in the form of LED arrays are used inter alia in the automotive sector for vehicle lighting. Alternatively, the light emitting semiconductor chip 2 can also be a laser chip or as a radiation detector chip.

The light emitting semiconductor chip 2 preferably comprises a ceramic substrate 21 on which a semiconductor light source 22 is fixed. The ceramic substrate 21 can consist of boron nitride (BN) or aluminum nitride (AlN), for example. Fixing can be carried out by adhesive bonding. The ceramic substrate 21 can contain a conductor track structure enabling the semiconductor light source 22 to be electrically connected. Preferably, the semiconductor light source 22 consists of a III-V semiconductor material and emits monochromatic light. A converter 23, as shown in FIG. 1A, can be arranged on the semiconductor light source 22 to set a light color altered relative to the light color of the semiconductor light source 22, e.g., a light color corresponding to daylight.

As is shown in FIG. 1A, the light emitting semiconductor chip 2 can be arranged in a cutout in the carrier substrate 3, wherein the ceramic substrate 21 is preferably adhesively bonded. In this case, the carrier substrate 3 can be a metal-core circuit board. On the surface of the carrier substrate 3, a contact structure 4, preferably in the form of a conductor track layer, is arranged in a manner adjoining the cutout. The contact structure 4 is spaced apart from the light emitting semiconductor chip, wherein the contact structure 4 and the light emitting semiconductor chip 2 electrically connect via connecting lines 6, preferably soldered or bonded connection wires.

Furthermore, a frame part 5 is arranged on the contact structure 4. In this case, the frame part 5 is closed and designed such that it completely surrounds the light emitting semiconductor chip 2, as is shown in the plan view in FIG. 1B. A cavity 9 is thus formed by carrier substrate 3 and frame part 5, the light emitting semiconductor chip 2 being arranged in the cavity.

The frame part furthermore has, at the upper inner edge 12 facing the light emitting semiconductor chip, a projection 14 extending at least partly over the contact structure 4. This configuration achieves an improved protection of the connection wires 4 against mechanical damage in particular in the context of the production process.

The cavity 9 can be partly or wholly filled with a potting compound 10, whereby the light emitting semiconductor chip 2 with the connection wires 6 to the contact structure 4 is encapsulated. It is also possible for the potting compound 10 to shape an elevation, for example, in the form of a lens above the plane defined by the surface 6 of the frame part 5. In this case, the frame part 5 acts as delimitation for the potting compound 10.

As a result of the encapsulation in the potting compound 10, the light emitting semiconductor chip 2 and also connection wires 6 are protected against external environmental influences such as moisture or dust, but also against mechanical damage. The potting compound 10 is transparent to electromagnetic radiation emitted from the surface of the light emitting semiconductor chip 2 if the potting compound as shown in FIG. 1A, covers the semiconductor light source 22 with the converter 23. The potting compound 10 can consist, for example, of silicone or epoxy, or of a mixture of silicone and epoxy. Furthermore, the potting compound 10 can contain light scattering or reflective particles and/or a luminescence conversion material. By way of example, the potting compound 10 can consist of silicone filled with titanium dioxide. A homogeneous luminance is achieved by such a potting compound.

However, there is also the possibility that the potting compound 10 in the cavity only laterally encloses and fixes the light emitting semiconductor chip 2, but does not cover the semiconductor light source 22 with the converter 23, as shown in the example in FIG. 1A. The potting compound then need not be transparent.

The frame part 5 is shaped as an injection-molded body 8. By way of example, epoxy resins, silicone resins or epoxy-silicone hybrid resins can be used as materials for this. A diaphragm part 11 is arranged at the top side of the frame part 5 and forms the upper inner edge 12 of the frame part 5 with the projection 14 (FIG. 1A).

In this case, the frame part 5 and the cavity 9 can have a rectangular shape in plan view (FIG. 1B). However, a round shape is also possible. In the rectangular shape, the upper inner edges of the cavity can be straight or curved. The corners can also be rounded. The diaphragm part 11 is produced with very small tolerances and can therefore perform the function of a diaphragm edge.

The diaphragm part 11 has protuberances 13 acting as anchorings of the diaphragm part 11 in the injection-molded body 8. A better cohesion of the diaphragm part 11 and the injection-molded body 8 is thus achieved. The risk of detachment of the diaphragm part 11 from the injection-molded body 8 can thus largely be avoided.

It is alternatively possible for the frame part 5 to enclose the light emitting semiconductor chip 2 only partly such that the diaphragm edge is shaped, for example, only at one side, at two sides or else at three sides. In this case, the functionality of the cavity 9 and thus the encapsulation by the potting compound 10 are dispensed with such that delimitation by the frame part 5 is not necessary.

The diaphragm part 11 can consist of a conductive material and have metallic conductivity. Therefore, in the optoelectronic component 1 the diaphragm part 11 can be used to contact electrical component parts. In this regard, further component parts arranged on the contact structure 4, for example, can electrically connect to one another via the diaphragm part 11. This enables a higher flexibility in layout and contacting. Electrical connections to the diaphragm part 11 can be realized by soldering and wire bonding. Furthermore, the light emitting semiconductor chip 2 can also electrically connect to the diaphragm part 11 via connection wires, for example. In this case, the diaphragm part 11 is preferably formed from a metal, for example, aluminum, copper, silver or gold, or a metallic alloy containing at least one such metal.

Alternatively, the diaphragm part 11, if it does not have a conduction function, can be insulating at the surface and consist of anodized aluminum, for example. It is also possible to produce the diaphragm part 11 from nonconductive material, for example, from suitable plastics.

Use of an injection-molded body 8 for the frame part 5 is advantageous in a number of points. In this regard, the costs for production are significantly lower than when a silicon frame part is used. Furthermore, a significantly improved mechanical stability is achieved. This in turn facilitates mounting and makes it possible to produce larger and longer chip arrays compared to use of a monocrystalline silicon frame part.

Alternatively, it is also possible to dispense with the functional feature of the diaphragm edge of the frame part if narrow tolerances for the diaphragm edge are not demanded. In this case, the frame part can be an injection-molded body without a diaphragm part. Furthermore, there is the possibility of the diaphragm part being provided as a stiffening element on the underside of the injection-molded body instead of as a diaphragm edge at the upper inner edge of the cavity. If the stiffening element then consists of metal, a soldering connection to the carrier substrate or the contact structure on the carrier substrate can also be implemented, which provides for an improved stability of the connection.

Alternatively, the frame part can also be without a projection at the upper inner edge facing the light emitting semiconductor chip. The frame part can also be arranged directly on the then enlarged ceramic substrate of the light emitting semiconductor chip. The contact structure of the carrier substrate is then spaced apart from the frame part, wherein the connection wires are led from the ceramic substrate across the frame part onto the contact structure. The potting compound then concomitantly covers the connection wires and the frame part.

A method of producing the optoelectronic component 1 in accordance with the example shown in FIGS. 1A and 1B is explained below on the basis of the schematic sectional views in FIGS. 2A to 2C.

Figure 2A:
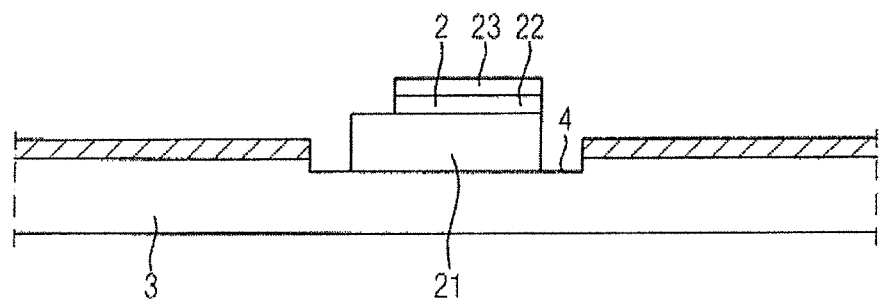
FIGS. 2A to 2C show a method of producing an optoelectronic component in accordance with the example shown in FIGS. 1A and 1B on the basis of intermediate steps illustrated in sectional view.

As shown in FIG. 2A, the carrier substrate 3 having the cutout is provided. The conductor track layer 4 is arranged on the surface of the carrier substrate 3 in a manner adjoining the cutout. The light emitting semiconductor chip 2 is adhesively bonded in the cutout. Furthermore, the conductor track layer 4 and the light emitting semiconductor chip 2 electrically connect via soldered or bonded connection wires 6.

The frame part 5 is produced using injection-molding technology, for example, using QFN technology (QFN— quad flat no-lead) by the diaphragm part 11 being encapsulated by molding. This gives rise to an injection-molded body 8, which has the diaphragm part 11 at its top side and which encloses the protuberances 13 of the diaphragm part 11.

Thinner frame part having thicknesses of the injection-molded body 8 over the diaphragm part 11 of a minimum of 200 µm can be produced with the aid of the injection-molding method. Comparable silicon frame parts have a minimum thickness of 275 µm. Therefore, the use of a frame part based on an injection-molded body 8 allows a more compact construction of the optoelectronic component 1.

Figure 2B:
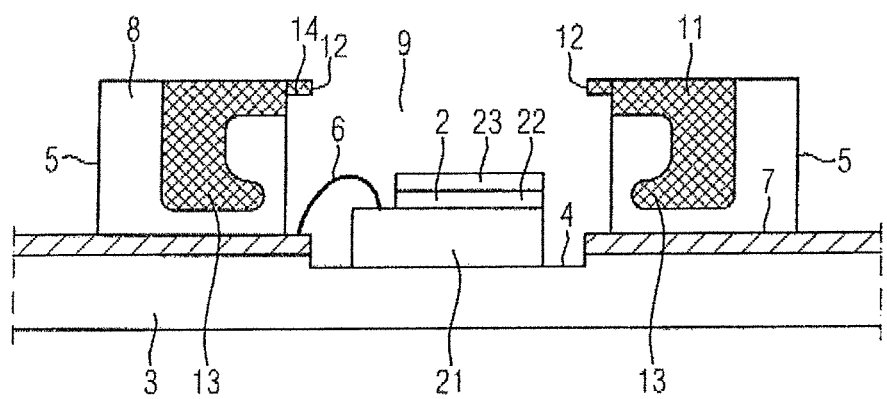

As illustrated in FIG. 2B, the frame part 5 is adhesively bonded by its underside onto the conductor track layer 4 arranged on the carrier substrate 3. In this case, the frame part 5 is placed such that the upper inner edge 12 of the diaphragm part 11 is at a defined distance from the light emitting semiconductor chip 2. As a result, the edge of the diaphragm part 11 can act as a defined diaphragm edge, for example, for low-beam arrangements. The projection 14 of the frame part 5 at the upper inner edge 12 facing the light emitting semiconductor chip 2 extends at least partly over the contact structure the conductor track layer 4 and covers the soldered or bonded connection wires 6 in the region of the conductor track layer 4, whereby improved protection of the connection wires against mechanical damage is achieved.

Figure 2C:
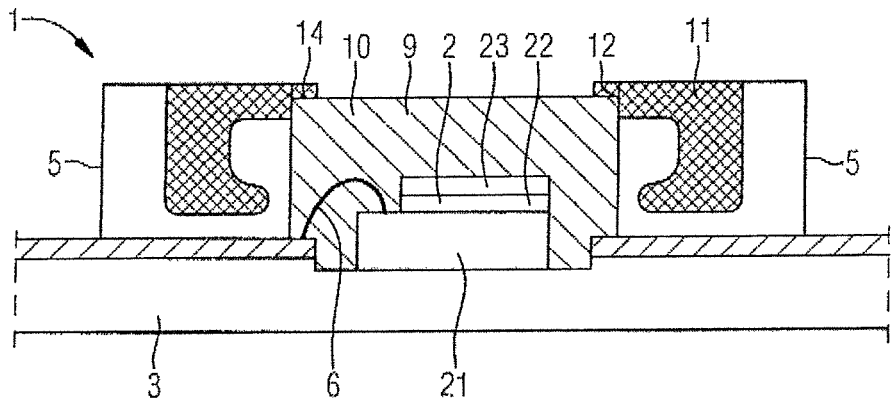

As illustrated in FIG. 2C, the cavity 9 produced by the frame part 5 is filled with potting compound 10. In this case, the frame part 5 acts as delimitation for the liquid potting compound.

Our components and methods are not restricted by the description on the basis of the examples. Rather, this disclosure encompasses any novel feature and also any combination of features and, in particular, includes any combination of features even if the feature or combination itself is not explicitly specified in the appended claims or the examples.

The invention claimed is:

1. An optoelectronic component comprising:
   a carrier substrate;
   at least one light emitting semiconductor chip arranged on a surface of the carrier substrate; and
   a frame part at least laterally partly surrounding the light emitting semiconductor chip and an injection-molded body and a diaphragm part;
   wherein the diaphragm part forms an upper inner edge of the frame part facing the light emitting semiconductor chip, the diaphragm part has metallic conductivity, and component parts electrically connect to one another via the diaphragm part.

2. The optoelectronic component as claimed in claim 1, wherein the frame part encloses the light emitting semiconductor chip and forms a cavity at least partly filled with a potting compound.

3. The optoelectronic component as claimed in claim 2, further comprising a contact structure arranged on the surface of the carrier substrate and extending below the frame part into the cavity and spaced apart from the light emitting semiconductor chip, wherein the contact structure and the light emitting semiconductor chip electrically connect via a connecting line, and the frame part has, at an upper inner edge facing the light emitting semiconductor chip, a projection extending at least partly over the contact structure.

4. The optoelectronic component as claimed in claim 1, wherein the frame part has a diaphragm part forming the upper inner edge facing the light emitting semiconductor chip and connects to the injection-molded body.

5. The optoelectronic component as claimed in claim 4, wherein the diaphragm part has a protuberance enclosed by the injection-molded body.

6. The optoelectronic component as claimed in claim 1, wherein the semiconductor chip comprises a ceramic carrier and an LED chip.

7. An optoelectronic component comprising:
a carrier substrate;
at least one light emitting semiconductor chip arranged on a surface of the carrier substrate;
a frame part at least laterally partly surrounding the light emitting semiconductor chip and forming a cavity; and
a contact structure arranged on the surface of the carrier substrate and extending below the frame part into the cavity and spaced apart from the light emitting semiconductor chip,
wherein the contact structure and the light emitting semiconductor chip electrically connect via a connecting line, and the frame part has, at the upper inner edge facing the light emitting semiconductor chip, a projection extending at least partly over the contact structure, and the diaphragm part has metallic conductivity, and component parts electrically connect to one another via the diaphragm part.

8. The optoelectronic component as claimed in claim 7, wherein the cavity is at least partly filled with a potting compound.

9. The optoelectronic component as claimed in claim 7, wherein the frame part comprises an injection-molded body.

10. The optoelectronic component as claimed in claim 7, wherein the frame part has a diaphragm part forming the upper inner edge facing the light emitting semiconductor chip and connects to the injection-molded body.

11. The optoelectronic component as claimed in claim 10, wherein the diaphragm part has a protuberance enclosed by the injection-molded body.

12. The optoelectronic component as claimed claim 7, wherein the semiconductor chip comprises a ceramic carrier and an LED chip.

* * * * *